(12) United States Patent
Miura et al.

(10) Patent No.: US 6,437,479 B1
(45) Date of Patent: Aug. 20, 2002

(54) SURFACE ACOUSTIC WAVE DEVICE

(75) Inventors: Michio Miura; Takashi Matsuda; Osamu Ikata, all of Kawasaki (JP)

(73) Assignees: Fujitsu Limited, Kawasaki; Fujitsu Media Devices Limited, Oazo, both of (JP)

( * ) Notice: Subject to any disclaimer, the term of this patent is extended or adjusted under 35 U.S.C. 154(b) by 0 days.

(21) Appl. No.: 09/994,754

(22) Filed: Nov. 28, 2001

(30) Foreign Application Priority Data

Jun. 29, 2001 (JP) ........................................ 2001-199219

(51) Int. Cl.⁷ ................................................ H03H 9/25
(52) U.S. Cl. ..................................................... 310/313 R
(58) Field of Search ..................................... 310/313 R (56) References Cited

U.S. PATENT DOCUMENTS

| | | | |
|---|---|---|---|
| 4,216,401 A | * 8/1980 | Wagner | 310/313 R |
| 5,129,262 A | * 7/1992 | White et al. | 310/313 R |
| 5,329,208 A | * 7/1994 | Imai et al. | 310/313 A |
| 5,355,568 A | * 10/1994 | Imai et al. | 29/25.35 |
| 5,708,402 A | * 1/1998 | Hachisu et al. | 310/313 R |
| 5,910,286 A | * 6/1999 | Lipskier | 422/68.1 |
| 6,236,141 B1 | * 5/2001 | Sato et al. | 310/313 R |

FOREIGN PATENT DOCUMENTS

| | | | |
|---|---|---|---|
| JP | 2001-53579 | 2/1923 | H03H/9/45 |
| JP | 63-307326 | * 12/1988 | G01L/9/00 |
| JP | 03-101280 | 4/1991 | H01L/41/18 |
| JP | 11-055070 | 2/1999 | H03H/9/25 |

OTHER PUBLICATIONS

H. Sato, et al., 1998 IEEE Ultrasonics Symposium, pp. 335–338, 7/98.

* cited by examiner

*Primary Examiner*—Thomas M. Dougherty
(74) *Attorney, Agent, or Firm*—Armstrong, Westerman & Hattori, LLP (57) ABSTRACT

The surface acoustic wave device includes a piezoelectric substrate having formed on a surface thereof an interdigital transducer for exciting a surface acoustic wave, a cavity formed on a back surface of the piezoelectric substrate on a region corresponding to the region where the interdigital transducer is formed, and a low expansion material buried in the cavity.

7 Claims, 7 Drawing Sheets

|  | Sample 1 | Sample 2 | Sample 3 | Conventional device |
|---|---|---|---|---|
| Thickness $L_1$ of LT substrate (μm) | 350 | 150 | 350 | - |
| Thickness $W_1$ of quartz film (μm) | 50 | 50 | 0.4 | none |
| Stress T (MPa) | -45.1 | -84.6 | 0.257 | - |
| TCF (ppm/°C) | -36 | -31 | -39.9 | -40 |

|  | Sample 2-1 | Sample 2-2 | Sample 2-3 | Sample 2-4 |
|---|---|---|---|---|
| Thickness $L_3$ of cavity part LT (μm) | 30 | 30 | 100 | 100 |
| Low expansion material | quartz | alumina | quartz | alumina |
| Thickness $L_2$ of low expansion material (μm) | 30 | 30 | 250 | 250 |
| Stress T (MPa) | -42 | -81 | -148 | -173 |
| TCF (ppm/°C) | -36 | -32 | -22 | -17 |

|  | Sample 3-1 | Sample 3-2 | Sample 3-3 |
|---|---|---|---|
| Thickness $L_1$ of LT substrate (μm) | 100 | 200 | 350 |
| Low expansion material 5<br><br>Thickness $L_5$ of low expansion material 5 (μm) | quartz<br><br>300 | quartz<br><br>300 | quartz<br><br>300 |
| Stress T (MPa) | -214 | -141 | -65 |
| TCF (ppm/°C) | -8 | -23 | -33 |

FIG. 10

|  | Sample 3-1 | Sample 3-4<br><br>4 times IDT | Sample 3-5<br><br>16 times IDT |
|---|---|---|---|
| Thickness $L_1$ of LT substrate (μm) | 100 | 100 | 100 |
| Low expansion material 5<br><br>Thickness $L_5$ of low expansion material 5 (μm) | quartz<br><br>300 | quartz<br><br>300 | quartz<br><br>300 |
| Size of cavity 4 (μm × μm) | 100 × 400 | 200 × 800 | 400 × 1,600 |
| Stress T (MPa) | -214 | -201 | -157 |
| TCF (ppm/°C) | -8 | -9 | -18 |

United States Patent [Number reference omitted]

SURFACE ACOUSTIC WAVE DEVICE

CROSS-REFERENCE TO RELATED APPLICATION

This application is related to Japanese Patent Application No. 2001-199219 filed in Jun. 29, 2001, whose priority is claimed under 35 USC §119, the disclosure of which is incorporated by reference in its entirety.

BACKGROUND OF THE INVENTION

1. Field of the Invention

The present invention relates to a surface acoustic wave device, and more particularly, it relates to a surface acoustic device comprising a piezoelectric substrate having thereon an electrode for exciting a surface acoustic wave.

2. Description of the Related Art

Filters and resonators utilizing a surface acoustic wave (SAW) have such characteristics that they are small-sized and inexpensive. Therefore, today, a surface acoustic wave device is widely used in a band-pass filter and a duplexer of a communication equipment, such as a portable telephone.

In recent years, a filter using the surface acoustic wave device is demanded to have high capability along with the advance in performance of the portable telephone and the like. However, there is a problem in that the pass band shifts due to temperature variation, and thus improvement of the temperature stability is demanded.

Lithium tantalate (hereinafter abbreviated as LT), which is frequently used as a material for a substrate of the surface acoustic wave device at present, is a material advantageous for realizing broad band filter characteristics and is a piezoelectric material having a large electromechanical coupling factor. However, it disadvantageously has poor temperature stability in comparison to a quartz substrate. As the general tendency of piezoelectric materials, materials having a large electromechanical coupling factor are inferior in temperature stability, whereas materials excellent in temperature stability, such as quartz, have a disadvantage of a small electromechanical coupling factor.

Various proposals have been made in order to realize a material having a large electromechanical coupling factor and excellent temperature stability.

For example, such a substrate has been proposed that is formed with a lithium niobate (hereinafter abbreviated as LN) or LT substrate having on the whole surface thereof a quartz film having an opposite temperature coefficient (IEEE Trans. on Sonics and Ultrasonics, vol. SU-31, pp. 51 to 57 (1984)).

It has been also proposed that a polarization inversion layer having a thickness equal to or smaller than a SAW wavelength is formed on a surface of an LT substrate, and the temperature stability is improved by utilizing the electric field shunt effect thereof (Japanese Patent No. 2,516,817).

Furthermore, such a surface acoustic wave device has been proposed that is to be improved in temperature stability by coupling a thin piezoelectric substrate and a thick low expansion material substrate through direct coupling to suppress expansion and contraction of the piezoelectric substrate due to temperature variation (Japanese Unexamined Patent Publication No. Hei 11(1999)-55070, Proc. of IEEE Ultrasonics Symposium, pp. 335 to 338 (1998), etc.), and also a device has been proposed that realizes the similar structure by using an adhesive (The 20th Ultrasonic Symposium, November 1999).

Among the proposals having been made for realizing a surface acoustic wave device having a large electromechanical coupling factor and being excellent in temperature stability, the LN or LT substrate having a quartz film formed on the whole surface thereof is difficult to control the film quality of the quartz film to a constant state. Furthermore, because a quartz film is also formed on interdigital transducers (hereinafter abbreviated as IDT) for improving the temperature characteristics, the propagation loss of the surface acoustic wave becomes large, and the device has not yet been put into practical use.

In the method of forming a polarization inversion layer on a surface of an LT substrate, annealing at a high temperature immediately below the Curie point ($\leq 600°$ C.) is necessary, and thus there is a difficulty in controllability of the depth of the polarization inversion layer.

In the method where a low expansion material substrate is coupled with a piezoelectric substrate, the coupling surfaces are necessarily mirror surfaces in order to suppress expansion and contraction due to temperature variation to obtain higher effects. As a result, however, it involves such a problem that reflection of the bulk wave occurs at the coupling interface to affect the surface acoustic wave, whereby the filter characteristics are deteriorated, and thus it has not yet been put into practical use.

In order to solve the problem, Japanese Unexamined Patent Publication No. 2001-53579 proposes a device produced by roughening the back surface of an LT substrate, and then it is coupled with a low expansion material by using an adhesive. However, the effect of improving the temperature stability of the device is lowered along with decrease of the adhesive force at the interface.

SUMMARY OF THE INVENTION

The invention provides a surface acoustic wave device comprising a piezoelectric substrate having formed on a surface thereof an interdigital transducer for exciting a surface acoustic wave, a cavity formed on opposite surface of the piezoelectric substrate in a region corresponding to a region where the interdigital transducer is formed, and a low expansion material buried in the cavity.

According to the invention, the temperature stability can be improved without deterioration of the electromechanical coupling factor.

The term "low expansion" signifies the thermal expansion coefficient lower than that of the substrate.

DESCRIPTION OF THE PREFERRED EMBODIMENTS

The invention also provides a surface acoustic wave device comprising a piezoelectric substrate having formed on a surface thereof an interdigital transducer for exciting a surface acoustic wave, a low expansion material formed in contact with another surface of the piezoelectric substrate on which the interdigital transducer is not formed, the low expansion material having a thermal expansion coefficient lower than that of the piezoelectric substrate and having a cavity formed on the low expansion material in a region corresponding to a region where the interdigital transducer is formed.

According to the invention, the temperature stability is improved, and the influence of the reflection of the bulk wave at the coupling interface to the surface acoustic wave can be suppressed, whereby deterioration of the filter characteristics can be prevented.

In order to improve the temperature stability, it is preferred that the cavity has a depth that is equal to or larger than a thickness of the low expansion material.

In order to reduce the influence of the reflection of the bulk wave, it is preferred that the surface of the piezoelectric substrate in contact with the cavity formed in the low expansion material is a roughened surface.

Furthermore, the device may further comprise a polarization inversion layer which is formed on a surface of the piezoelectric substrate on which the interdigital transducer is formed and has a thickness of five or less times as great as a wavelength of the surface acoustic wave. According to the constitution, the temperature stability is further improved.

The invention will be described in detail with reference to embodiments shown in the drawings, but the invention is not limited thereto. Values indicating the temperature stability shown in the following examples are calculated by structural analysis simulation using the finite element method. It has been found that there is an approximate relationship between the thermal stress T obtained by the simulation upon applying temperature variation and the temperature coefficient of frequency (hereinafter abbreviated as TCF) showing the temperature stability of a surface acoustic wave device, as expressed by the following equation.

$$TCF = 0.00033 \cdot T^2 - 0.0862 \cdot T - 39.84$$

The unit for the TCF is ppm/°C., and the unit for the stress T is MPa.

The TCF values in the examples are those derived by the relationship. A surface acoustic wave device formed by providing an interdigital transducer on an LT–42° Y-X substrate that has been subjected to no measure for improving the temperature stability has a TCF of about −40 ppm/°C. The substrate that has been subjected to no measure for improving the temperature stability means that a substrate on which an interdigital transducer (IDT) for exciting the surface acoustic wave (hereinafter abbreviated as SAW) is simply provided, i.e., a substrate that has not been coupled with a low expansion material and so on.

In the case where a substrate formed of other materials or a substrate having a different azimuth is used, it is necessary in a strict means to obtain a relational expression by carrying out the similar simulation and experiments. In the case of a substrate having a cut angle near LT–42° X-Y of the LT substrate, an approximate relationship can be obtained by modifying in such a manner the TCF is adjusted to the original TCF of that cut angle when T=0.

FIRST EXAMPLE

Figure 1:
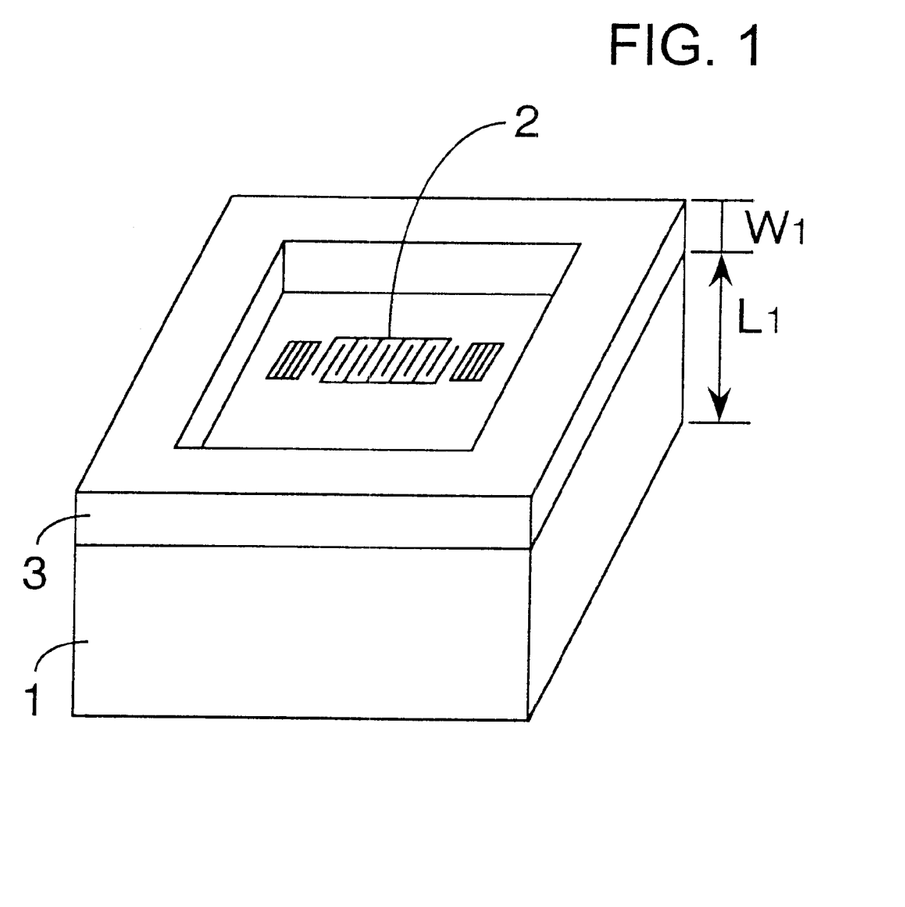
FIG. 1 is a perspective view showing a constitution of a first example of a surface acoustic wave device according to the invention.

FIG. 1 is a perspective view showing a constitution of the first example of the surface acoustic wave device according to the invention. In the first example, an IDT resonator 2 formed of aluminum is provided on an LT substrate 1, and a protective film 3 having a smaller thermal expansion coefficient than that of the LT substrate 1 is formed on margins around the IDT resonator 2 on the surface of the substrate 1 to surround the IDT resonator 2. The protective film 3 is formed of a quartz ($SiO_2$) film. The protective film 3 is a low expansion film having a function of restricting expansion and contraction of the substrate 1, and may be formed of any material as far as the film has a smaller thermal expansion coefficient than that of the substrate 1.

In general, the thermal expansion coefficient $T_0$ in the propagation direction of the SAW of the LT substrate 1 is $16.1 \times 10^{-6}$/°C., and the thermal expansion coefficient $T_1$ of the quartz film 3 is $5.7 \times 10^{-7}$/°C.

The quartz film 3 can be formed by sputtering, CVD, vapor deposition or spin coating, and the quartz film 3 can be patterned by etching or lift off.

The film forming method and the patterning method may be other methods than the above as far as they do not adversely affect the surface of the substrate on the region where the IDT resonator 2 is formed. For example, it is possible that the quartz film 3 is formed on the margins around the region where the IDT resonator 2 is to be formed, and then the IDT resonator 2 is formed.

The IDT resonator 2 herein is constituted by a so-called interdigital transducer for exciting the SAW and generally has such a constitution that an interdigital transducer (IDT) is arranged at the center, and reflectors are arranged on both sides of the IDT in the propagation direction of the excited SAW. The IDT and the reflectors are formed of a thin metallic film of, for example, aluminum or gold, having a thickness of about 1 μm or less.

Figure 2:
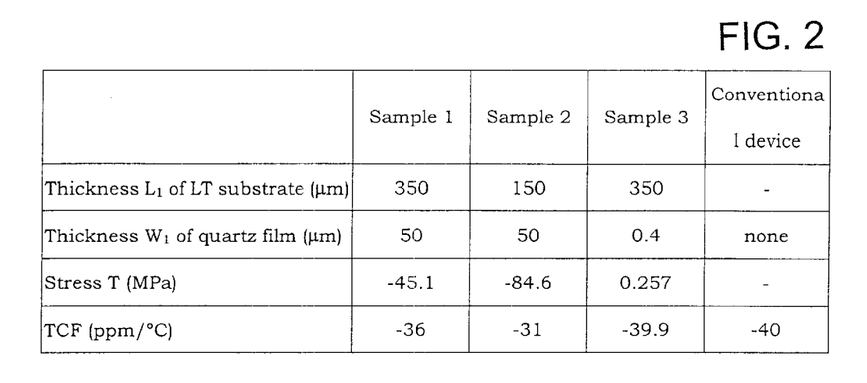
FIG. 2 is a diagram showing simulation results of the temperature characteristics of the device of the first example and the conventional device.

Results of simulation using the thicknesses of the LT substrate 1 and the quartz film 3 as parameters are shown in FIG. 2.

In FIG. 2, samples 1 and 2 of the present invention have a thickness $W_1$ of the quartz film 3 of 50 μm, which is larger than a thickness $W_0$ of the interdigital transducer (0.4 μm), and sample 3 has a thickness that is the same as that of the interdigital transducer (0.4 μm). A conventional device having no quartz film (TCF=−40 ppm/°C.) is also shown in FIG. 2 for comparison.

In the case of the samples 1 and 2 wherein a quartz film having a thickness of 50 μm ($W_1$) is formed around the IDT and a thickness ($L_1$) of the LT substrate is 350 and 150 μm, respectively, the stress T is −45.1 and −84.6 MPa, and thus the TCF is −36 and −31 ppm/°C. according to the foregoing expression. Therefore, according to the comparison of the TCF values, the samples 1 and 2 exert improvement of the temperature stability by 10% and 23%, respectively, with respect to −40 ppm/°C. of the conventional device having only the LT substrate.

In the case where the thickness of the quartz film 3 is the same as that of the interdigital transducer as in the sample 3, the TCF is −39.9 ppm/°C., and therefore, it is necessary that the thickness $W_1$ of the quartz film 3 is at least larger than the thickness $W_0$ of the interdigital transducer. In particular, the thickness $W_1$ of the quartz film 3 and the thickness $W_0$ of the interdigital transducer preferably have the relationship of about $W_1 \geq 50\ W_0$.

With respect to the relationship between the thermal expansion coefficients of the LT substrate 1 and the quartz film 3, it is sufficient that the thermal expansion coefficient $T_1$ of the quartz film 3 is smaller than the thermal expansion coefficient $T_0$ of the LT substrate 1 from the standpoint of suppressing expansion and contraction of the LT substrate due to temperature variation.

Figure 3:
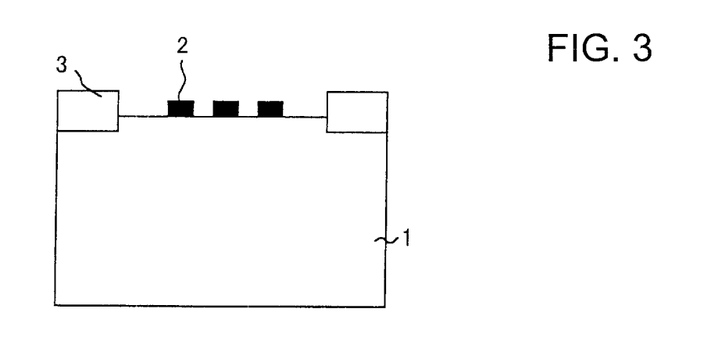
FIG. 3 is a cross sectional view showing a constitution of the first example of a surface acoustic wave device according to the invention.

Furthermore, as shown in FIG. 3, it is possible that the region around the IDT resonator 2 on the surface of the LT substrate 1 is scraped by several μm, and the quartz film 3 is then formed thereon. In this configuration, the temperature stability is improved since the expansion and contraction of the LT substrate 1 having the IDT resonator 2 thereon can be also suppressed in the transversal direction.

SECOND EXAMPLE

Figure 4:
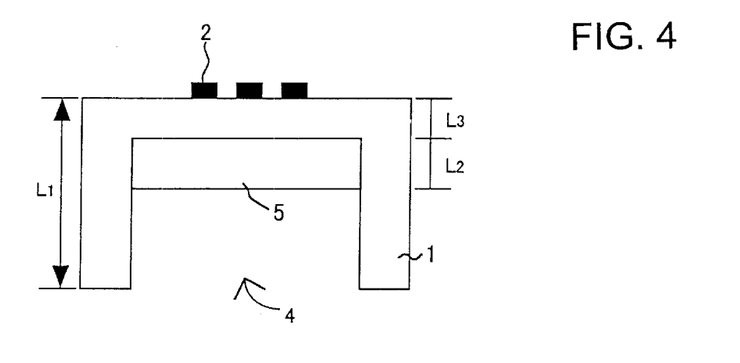
FIG. 4 is a cross sectional view showing a constitution of a second example of a surface acoustic wave device according to the invention.

FIG. 4 is a schematic cross sectional view showing the second example of the invention. An IDT resonator 2 formed of aluminum is provided on an LT substrate 1, and a cavity 4 is formed on the back surface of the LT substrate 1, on which the IDT resonator 2 is not formed.

The cavity can be formed by such a formation method as etching and sand blasting. A low expansion material 5 is formed on a bottom surface of the cavity 4. Examples of the low expansion material 5 include quartz or alumina. The low expansion material 5 can be formed by such a method as sputtering and CVD as similar to the first example, after the formation of the cavity 4.

In FIG. 4, the LT substrate 1 has a thickness $L_1$ of 350 μm and a thickness $L_3$ on the part where the cavity 4 is formed of 30 μm, and the low expansion material 5 has a thickness $L_2$ of about 100 μm.

The cavity 4 is formed on a surface opposite to the surface on which the IDT resonator 2 is formed, in a region corresponding to the region IDT resonator 2 is formed. The cavity 4 may have an area where substantially equal to the area of the IDT resonator 2. For example, when the region where the IDT resonator is formed has an area of about 500 μm×100 μm, a cavity 4 having the substantially equal area may be formed.

Figure 5:
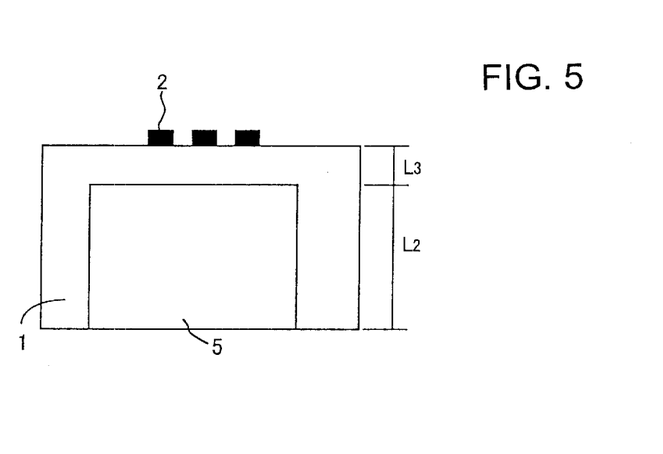
FIG. 5 is a cross sectional view showing a constitution of the second example of a surface acoustic wave device according to the invention.

Furthermore, as shown in FIG. 5, chips of the low expansion material may be buried in the entire cavity 4 by using an adhesive.

Figure 6:
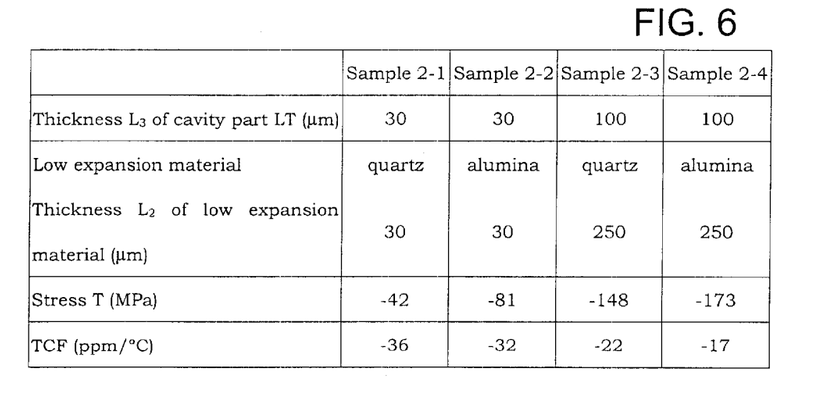
FIG. 6 is a diagram showing simulation results of the temperature characteristics of the device of the second example and the conventional device.

FIG. 6 shows the results of simulation using the thickness $L_3$ of the LT substrate 1 on the part where the cavity is formed and the thickness $L_2$ of the low expansion material 5 as parameters.

Samples 2-1 and 2-2 have the constitution shown in FIG. 4. The stress is −42 MPa in the case where quartz is used as the low expansion material 5 and is −81 MPa in the case where alumina is used, and the TCF is −36 ppm/°C. and −32 ppm/°C., respectively. Since the low expansion material 5 is formed to have a thickness of about 30 μm, both of the samples have TCF lower than the conventional sample (−40 ppm/°C.), thereby improving the temperature stability.

In samples 2-3 and 2-4 having the constitution shown in FIG. 5 where the thickness of the low expansion material is 250 μm, the stress is −148 MPa in the case where quartz is used as the low expansion material 5 and is −173 MPa in the case where alumina is used, and the TCF is lowered to −22 ppm/°C. and −17 ppm/°C., respectively. Consequently, the temperature stability is higher when the thickness of the low expansion material is larger than those in the samples 2-1 and 2-2.

Quartz has a smaller thermal expansion coefficient than alumina, but alumina has a large Young's modulus. Therefore, it is understood that alumina has a larger TCF improving effect than quartz on the assumption that they have the same thickness.

THIRD EXAMPLE

Figure 7:
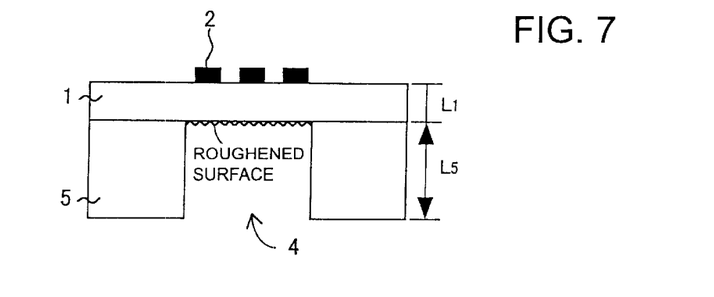
FIG. 7 is a cross sectional view showing a constitution of a third example of a surface acoustic wave device according to the invention.

FIG. 7 is a schematic cross sectional view showing the third example of the invention. In this example, an LT substrate 1 and a substrate formed of a low expansion material 5 are coupled by direct coupling to form a cavity 4. The cavity 4 is formed on a back surface and in a region opposite to the region where an IDT resonator 2 is formed. The cavity 4 is formed to have an area that is substantially equal to the area of the region where the IDT resonator 2 is formed. For example, both of the regions are rectangular regions of 100 μm×400 μm.

In order to reduce the influence of the bulk wave reflection, it is preferred that the exposed part of the back surface of the LT substrate 1 in the cavity is roughened. The roughening of the surface can be carried out by sand blasting.

The device according to this example can be produced in such a manner that the LT substrate 1 and the substrate formed of the low expansion material 5 are coupled, and then the cavity is formed by sand blasting. It is also possible that a through hole corresponding to the cavity 4 is opened in the low expansion material, which is then coupled with the LT substrate 1.

Figure 8:
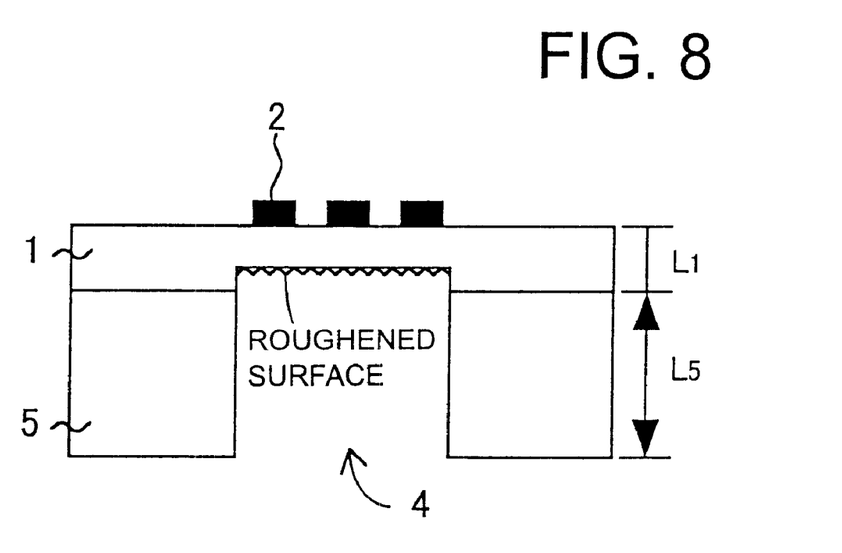
FIG. 8 is a cross sectional view showing a constitution of the third example of a surface acoustic wave device according to the invention.

Furthermore, as shown in FIG. 8, it is possible that the cavity 4 has a depth larger than the thickness of the low expansion material 5, whereby the LT substrate 1 forms a part of the cavity 4.

Figure 9:
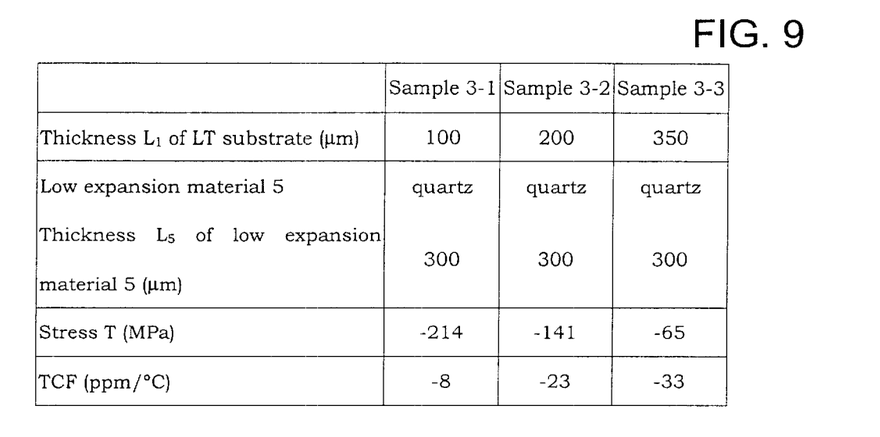
FIG. 9 is a diagram showing simulation results of the temperature characteristics of the device of the third example and the conventional device.
Figure 10:
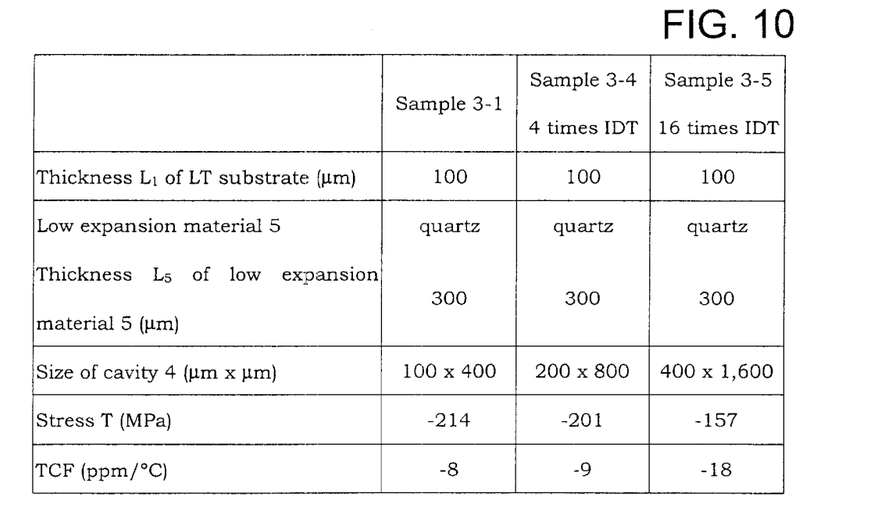
FIG. 10 is a diagram showing simulation results of the temperature characteristics of the device of the third example and the conventional device.

With respect to the third example, results of simulation using the thickness of the LT substrate 1 and others as parameters are shown in FIGS. 9 and 10. FIG. 9 shows the cases where the thickness $L_5$ of the low expansion material 5 is a constant value of 300 μm, and the thickness $L_1$ of the LT substrate 1 is varied. According to the results, in the case of the sample 3-1 where the thickness $L_1$ of the LT substrate 1 is 100 μm, the stress T is −214 MPa and the TCF is −8 ppm/°C., which caused the largest effect. In this case, the TCF is improved by 80% in comparison to the conventional device.

FIG. 10 shows the cases where the thickness $L_1$ of the LT substrate 1 is fixed to 100 μm, and the thickness $L_5$ of the low expansion material 5 is fixed to 300 μm, whereas the area of the region of the cavity 4 is varied. The size of the cavity 4 of the sample 3-1 is 100 μm×400 μm, which is the same as the size of the region where the IDT resonator 2 is formed. The size of the cavity of the sample 3-4 is four times larger than the size of the region where the IDT resonator 2 is formed, and the size of the cavity of the sample 3-5 is 16 times larger than the same. According to the results shown in FIG. 10, the stress T becomes the maximum and the TCF becomes the minimum in the case of the sample 3-1, thereby providing the highest temperature stability.

OTHER EXAMPLES

Figure 11:
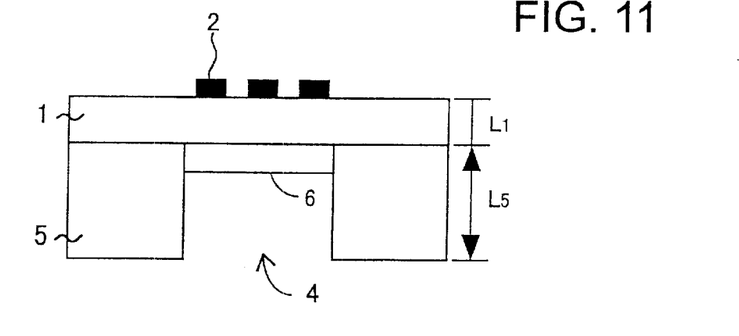
FIG. 11 is a cross sectional view showing a constitution of another example of a surface acoustic wave device according to the invention.

In order to reduce the influence of reflection of the bulk wave, it is possible to provide an acoustic material 6 in the cavity 4 as shown in FIG. 11. As the acoustic material 6, a resin, such as an epoxy resin, may be used. In this embodiment, the dimensions, such as the thickness $L_1$ of the LT substrate 1, may be the same as those in the embodiment shown in FIG. 7. The acoustic material 6 may be coated on the region of the cavity 4 (100 μm×400 μm) of the back surface of the LT substrate 1 by spin coating.

Figure 12:
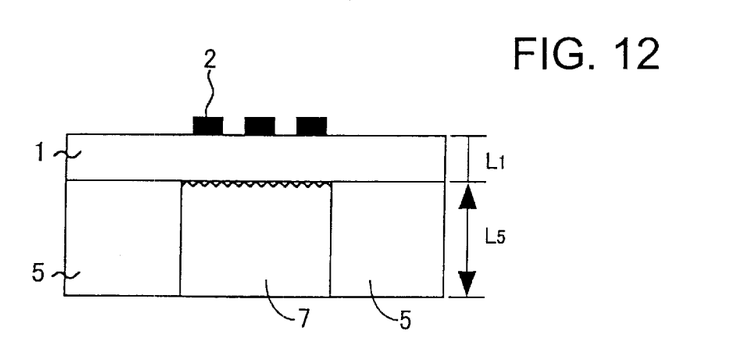
FIG. 12 is a cross sectional view showing a constitution of still another example of a surface acoustic wave device according to the invention.

Furthermore, as shown in FIG. 12, it is possible that the back surface of the LT substrate 1 on the region of the cavity 4 is roughened, and then a low expansion material 7 is formed in the cavity 4. According to the configuration, expansion and contraction of the LT substrate 1 is further suppressed to improve the temperature stability. The low expansion material 7 may be the same as the low expansion material 5, such as quartz, but different materials may be used as far as they have a smaller thermal expansion coefficient than that of the LT substrate 1.

Figure 13:
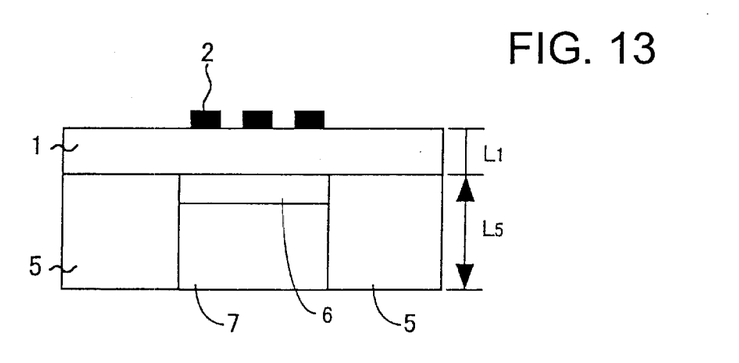
FIG. 13 is a cross sectional view showing a constitution of a further example of a surface acoustic wave device according to the invention.

Moreover, as shown in FIG. 13, it is possible that after forming the acoustic material 6 as shown in FIG. 11, a low expansion material 7 may be formed in the cavity 4. According to the configuration, similarly to FIG. 7, suppression of reflection of the bulk wave and improvement of the temperature stability can also be attained.

Figure 14:
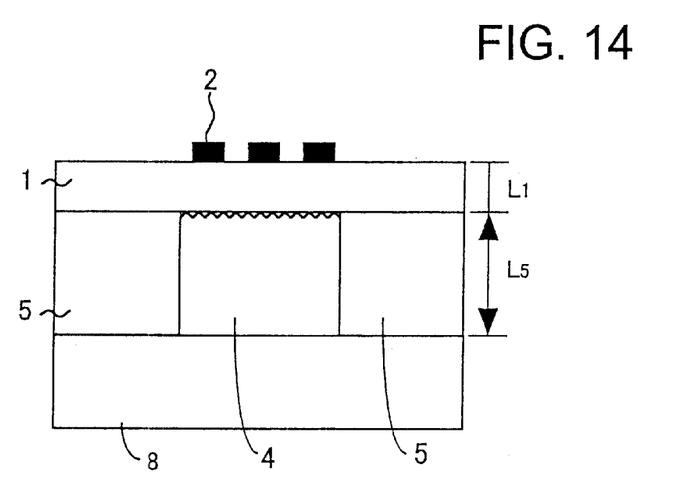
FIG. 14 is a cross sectional view showing a constitution of a still further example of a surface acoustic wave device according to the invention.

It is also possible that after roughening the back surface of the LT substrate 1 as shown in FIG. 7, a low expansion material substrate 8 may be coupled in contact with the low expansion material 5 while the cavity. 4 remains as a void as shown in FIG. 14. According to the configuration, it is not necessary to carry out the step of burying the low expansion material in the cavity 4, which is a more complicated step than the coupling step of the low expansion material substrate 8, thereby the production process of the device can be simplified, and the time required for the production can be shortened.

A further higher improvement effect of the temperature characteristics can be obtained by forming a polarization inversion layer, which has been conventionally employed, on the part of the LT substrate 1 where the IDT is formed shown in the first, second and third examples.

It is preferred that the polarization inversion layer is formed on the surface of the LT substrate 1 having the IDT resonator 2 formed thereon on the part where the IDT is formed, to a thickness of five or less times greater than the wavelength of the surface acoustic wave.

All the numerals including the parameters, the low expansion materials and the like referred in the examples are only for explanation and are non-limitative. The surface acoustic wave device is also not limited to that having one resonator, and the invention can be applied to a ladder filter and a DMS filter formed with plural resonators and a duplexer using the filters.

According to the invention, a surface acoustic wave device excellent in temperature stability can be provided while a large electromechanical coupling factor is maintained. Furthermore, the influence of reflection of the bulk wave can be suppressed even when substrates are coupled to each other, whereby deterioration of the filter characteristics can be prevented.

What is claimed is:

1. A surface acoustic wave device comprising a piezoelectric substrate having formed on a surface thereof an interdigital transducer for exciting a surface acoustic wave, a cavity formed on opposite surface of the piezoelectric substrate in a region corresponding to a region where the interdigital transducer is formed, and a low expansion material buried in the cavity.

2. A surface acoustic wave device according to claim 1, wherein the low expansion material has the thermal expansion coefficient lower than that of the substrate.

3. A surface acoustic wave device according to claim 1, wherein the low expansion material is an Si film, an $SiO_2$ film or an alumina film.

4. A surface acoustic wave device comprising a piezoelectric substrate having formed on a surface thereof an interdigital transducer for exciting a surface acoustic wave, a low expansion material formed in contact with another surface of the piezoelectric substrate on which the interdigital transducer is not formed, the low expansion material having a thermal expansion coefficient lower than that of the piezoelectric substrate and having a cavity formed on the low expansion material in a region corresponding to a region where the interdigital transducer is formed.

5. A surface acoustic wave device according to claim 4, wherein the cavity of the low expansion material has a depth equal to or larger than a thickness of the low expansion material.

6. A surface acoustic wave device according to claim 4, wherein the surface of the piezoelectric substrate contacting with the cavity of the low expansion material is roughened.

7. A surface acoustic wave device according to any one of claims 1 to 6, wherein the device further comprises a polarization inversion layer formed on the surface of the piezoelectric substrate on which the interdigital transducer has been formed, the polarization inversion layer having a thickness of five or less times as great as a wavelength of the surface acoustic wave.

* * * * *